United States Patent
Falconer et al.

(10) Patent No.: US 7,076,677 B2
(45) Date of Patent: Jul. 11, 2006

(54) SAME EDGE STROBING FOR SOURCE SYNCHRONOUS BUS SYSTEMS

(75) Inventors: Maynard C. Falconer, Portland, OR (US); Zane A. Ball, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 406 days.

(21) Appl. No.: 10/330,053

(22) Filed: Dec. 30, 2002

(65) Prior Publication Data

US 2004/0124893 A1 Jul. 1, 2004

(51) Int. Cl.
*G06F 1/12* (2006.01)
*G06F 1/04* (2006.01)
*G11C 7/00* (2006.01)
*G11C 7/22* (2006.01)

(52) U.S. Cl. ................. 713/400; 713/500; 713/502; 713/401; 713/600; 365/189.01; 365/205

(58) Field of Classification Search .................... None
See application file for complete search history.

(56) References Cited

U.S. PATENT DOCUMENTS

| | | | | |
|---|---|---|---|---|
| 5,964,856 A | * | 10/1999 | Wu et al. | 713/600 |
| 6,269,414 B1 | * | 7/2001 | Engdahl | 713/600 |
| 6,311,285 B1 | * | 10/2001 | Rodriguez et al. | 713/401 |
| 6,317,369 B1 | * | 11/2001 | Kubo et al. | 365/193 |
| 6,317,801 B1 | * | 11/2001 | Ilkbahar et al. | 710/58 |
| 2001/0046163 A1 | * | 11/2001 | Yanagawa | 365/194 |

* cited by examiner

*Primary Examiner*—Lynne H. Browne
*Assistant Examiner*—James K. Trujillo
(74) *Attorney, Agent, or Firm*—Schwegman, Lundberg, Woessner & Kluth, P.A.

(57) ABSTRACT

A source synchronous bus system is provided with a bus; a first device connected to the bus, having a driver to drive data and strobe signals, via the bus; and a second device connected to the bus, having a receiver to receive data and the strobe signals from the bus, and to select one of rising and falling edges of the strobe signals to latch a corresponding one of rising and falling edges of the data received from the bus, for subsequent data processing functions in order to compensate for systematic differences between rising and falling edges of the data received, via the bus.

23 Claims, 8 Drawing Sheets

SAME EDGE STROBING FOR SOURCE SYNCHRONOUS BUS SYSTEMS

FIELD

The present invention relates generally to data transfers across a bus between devices and, more specifically, relates to source synchronous transmission of data between devices within an electronic system.

BACKGROUND

Modern electronic systems such as computer systems contain multiple components or devices coupled to one or more buses. Typically, these devices are integrated circuit (IC) packages, known as "IC chips" with multiple interfaces coupling each device to a bus. The devices may include, for example, processors, micro-controllers, graphics controllers, bus interface circuits, input/output (IO) circuits, memory devices, mass storage devices, etc. In order for the computer system to operate properly, these devices should be able to communicate effectively with each other via the bus.

Existing computer systems typically transfer data between devices via one or more buses in accordance with a predefined clocking scheme. Data may be transferred between devices in a source synchronous fashion, i.e., the transmitting and receiving devices operate synchronously, in order to increase the speed of data transmission.

In a source synchronous scheme, one or more strobe (clock) signals are transmitted along with the data from the transmitting device along a transmission path, via one or more buses, utilizing current strobing techniques, such as, center strobing, concurrent strobing and/or differential strobing schemes. At the receiving device, the strobe signals are then used to latch or match the data transmitted from the transmitting device within a timing window (i.e., the time from outputting data from the transmitting device to the time that the receiving device samples such data in a clock cycle), for subsequent data processing functions.

However, the rising and falling edges of the data and strobe signals utilized by current strobing techniques on the buses commonly have different edge rates and timings due to process variations between the pull-up circuitry and the pull-down circuitry of the source synchronous driver in the transmitting device and due to different return paths for power and ground supplies or other effects such as noise and/or temperature variations. These effects create a systematic or consistent variation between the rising and falling edges of the data and strobe signals and drift to a metastable state that can undermine the system performance and data transfer rates.

Accordingly, there is a need for a source synchronous system in which the systematic variation between the rising and falling edges of the data and strobe signals can be effectively and efficiently compensated in order to provide improved timings and enhanced system performance.

BRIEF DESCRIPTION OF THE DRAWING(S)

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, example sizes/values/ranges may be given, although the present invention is not limited to the same. As manufacturing techniques mature over time, it is expected that GTL (Guide Transistor Logic)) and CMOS (Complementary Metal Oxide Semiconductor) buses and IC (Integrated Circuit) devices of smaller size can be manufactured. In addition, well known logic interfaces and connections to IC devices and other components may not be shown within the figures for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits)

are set forth in order to describe example embodiments of the invention, it should be apparent to one skilled in the art that the invention can be practiced without, or with variation of, these specific details.

The present invention is applicable for use with all types of electronic systems, digital buses, and IC devices, including, for example, micro-processors, micro-controllers, graphics controllers, bus interface circuits, input/output (I/O) circuits, memory circuits, and any other devices which may become available as semiconductor technology develops in the future.

Figure 1:
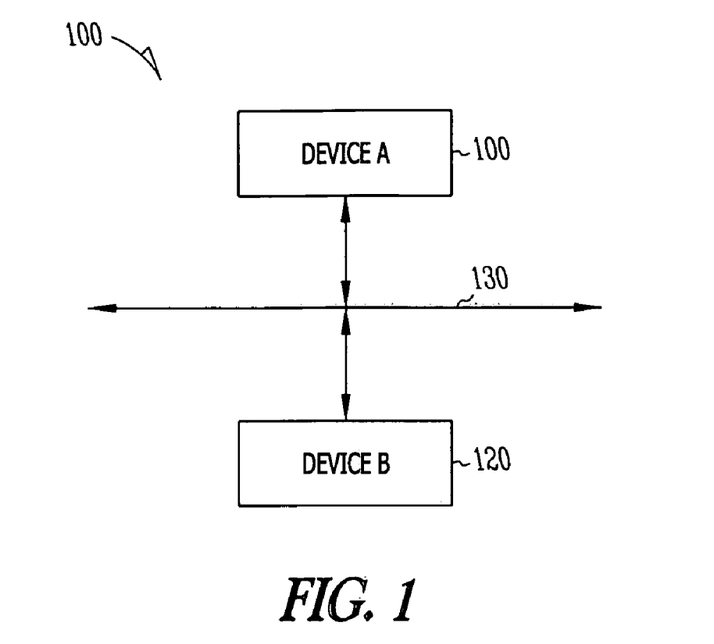
FIG. 1 illustrates an example system including a plurality of devices connected via a bus.

Attention now is directed to the drawings and particularly to FIG. 1, in which an example electronic system 100 including a plurality of devices 110–120 connected via a bus 130 according to an embodiment of the present invention is illustrated. The electronic system 100 may be a computer system (e.g., desktop, laptop, hand-held, server, etc.) that comprises devices 110-120, such as, processor subsystem, graphics controller, chipset logic, and external memory. These devices 110–120 may be mounted on a single printed circuit board (PCB) or multiple PCBs within the electronic system 100, and may be connected, via one or more buses. The processor subsystem may include one or more processors or any type of computational circuits, such as, but not limited to a micro-processor, a micro-controller, a complex instruction set computing (CISC) microprocessor, a reduced instruction set computing (RISC) microprocessor, a very long instruction word (VLIW) microprocessor, a digital signal processor (DSP), or any other type of processor or processing circuit. Chipset logic can be any one or more supporting circuits that couple the processor to external devices. For example, chipset logic can include memory controller circuits, bus interface circuits, debug circuits, node control circuits, port switching circuits, and so forth. External memory can include main memory in the form of dynamic random-access-memory (DRAM), video random-access-memory (VDRAM), one or more hard drives(s), and removable media such as diskettes, compact disks (CD's), digital video disks (DVD's), and the like.

The bus 130 may be a high-speed digital bus, such as, a front side bus (FSB) used to connect the memory controller the processor subsystem, an AGP or graphics bus used to connect to the graphics controller to the memory controller, and a memory bus or double data-rate (DDR) bus used to connect the memory controller to the main memory.

Figure 2:
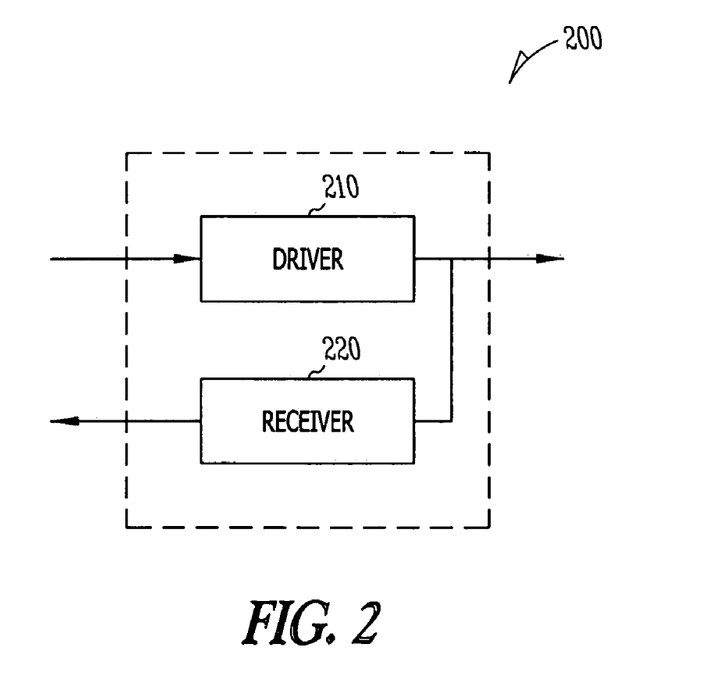
FIG. 2 illustrates an example I/O circuit including a driver and a receiver at a front end of a transmitting or receiving device shown in FIG. 1.

As shown in FIG. 2, each device 110 or 120 in the electronic system 100 may contain an I/O circuit 200 comprising a driver (i.e., transmitter) 210 for outputting data (i.e., encoded data driven by an internal core clock) to the bus 130, and a receiver 220 for receiving data (i.e., encoded data) from the bus 130, for subsequent data processing functions. For example, when the I/O circuit 200 is outputting data, the receiver 220 may be disabled and the driver 210 may be enabled to drive data, via the bus 130. When the I/O circuit 200 is receiving data, the driver 210 may be disabled and the receiver 220 may be enabled to receive data from the bus 130. Data may be transferred between devices 110 and 120 in a source synchronous fashion, i.e., the transmitting device 110 and the receiving device 120 operate synchronously, in order to increase the speed of data transmission.

In a source synchronous scheme, strobe (clock) signals may be transmitted along the same transmission path with the data (typically, in parallel with the data) from the transmitting device 110, via the bus 130, utilizing current strobing techniques, such as, center strobing, concurrent strobing and/or differential strobing schemes. In order to receive the data sent from the transmitting device 110, each strobe transition, either a rising edge or a falling edge of the strobe signals, may be used at the receiving device 120 to latch or match the data transmitted from the transmitting device within a timing window (i.e., the time from outputting data from the transmitting device to the time that the receiving device samples such data in a clock cycle), for subsequent data processing functions.

As previously explained, the rising and falling edges of the data and strobe signals utilized by current source synchronous strobing schemes on the bus 130 commonly have different edge rates and timings due to process variations between the pull-up circuitry and the pull-down circuitry of the source synchronous driver in the transmitting device 110 and due to different return paths for power and ground supplies or other effects such as noise and temperature variations. These effects create a systematic or consistent variation between the rising and falling edges of the data and strobe signals and drift to a metastable state that, in turn, undermine the system performance and data transfer rates.

Figure 3:
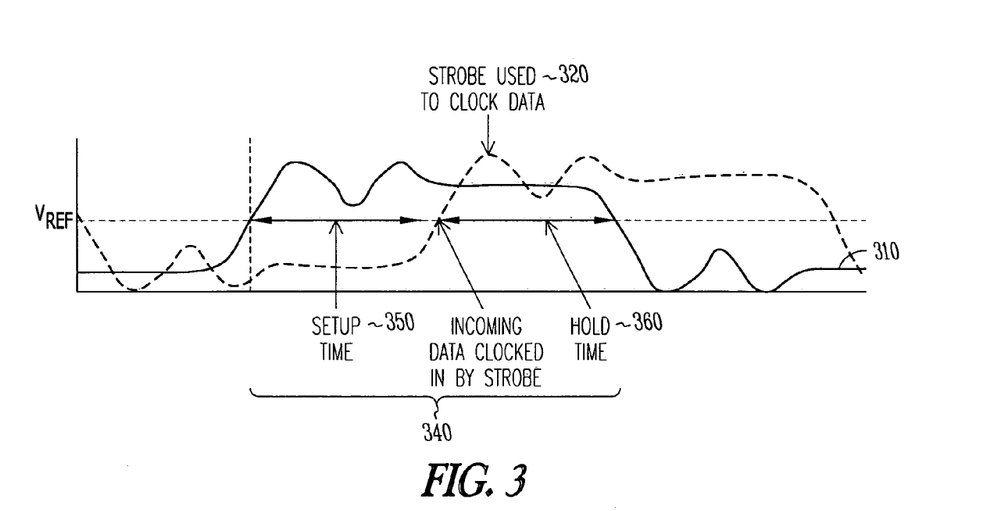
FIG. 3 illustrates an example waveform diagram of data (incoming data signal) and a strobe signal used to latch data at a receiving device utilizing a current source synchronous strobe scheme.
Figure 4:
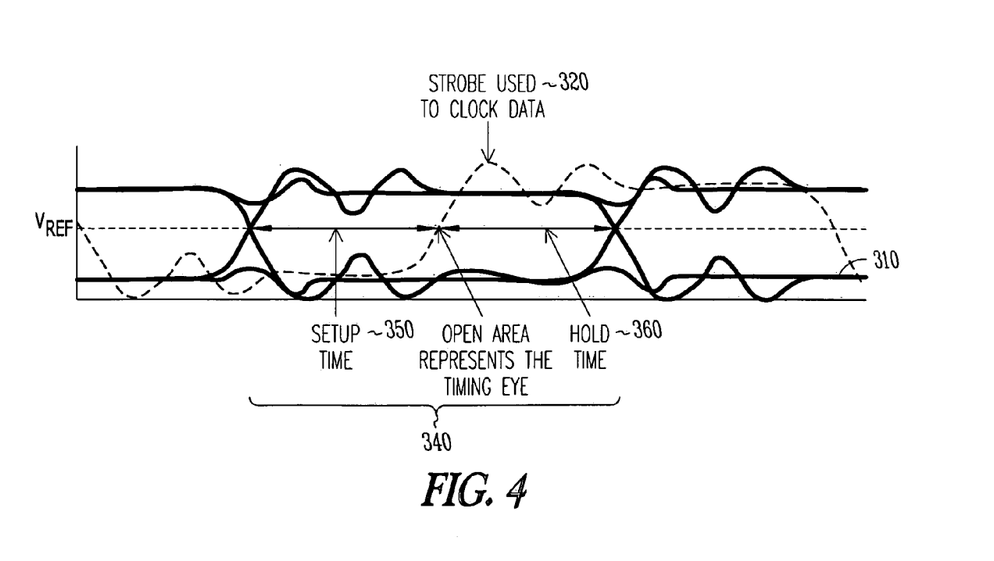
FIG. 4 illustrates an example timing eye diagram of the current source synchronous strobe scheme.
Figure 5A:
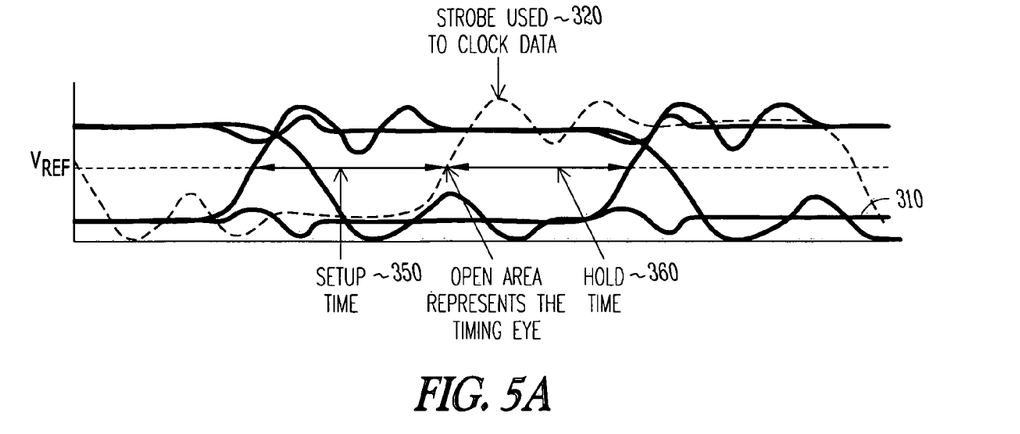
FIGS. 5A–5B illustrate an example timing eye diagram of the current source synchronous strobe scheme due to slow falling edges and fast falling edge of data.
Figure 5B:
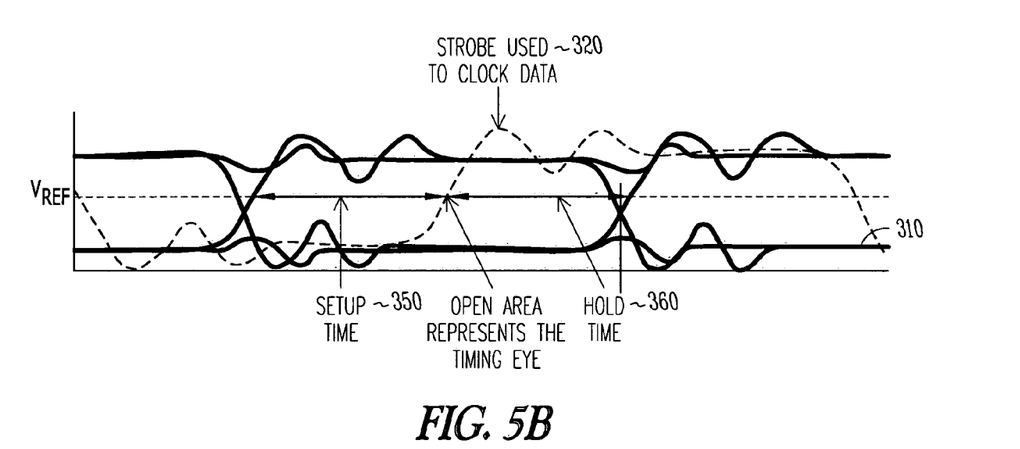
Figure 6:
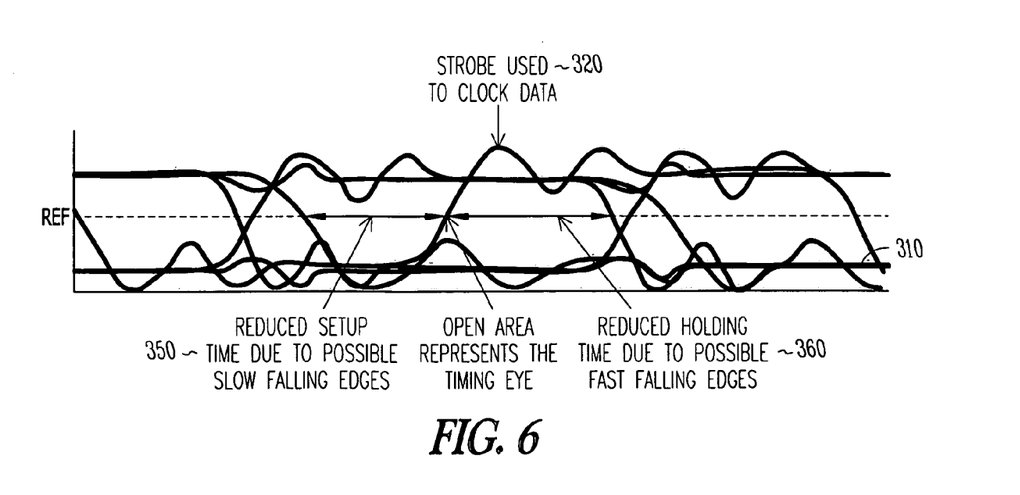
FIG. 6 illustrates an example timing eye diagram of the current source synchronous strobe scheme due to potential slow or fast falling edges of data.
Figure 7:
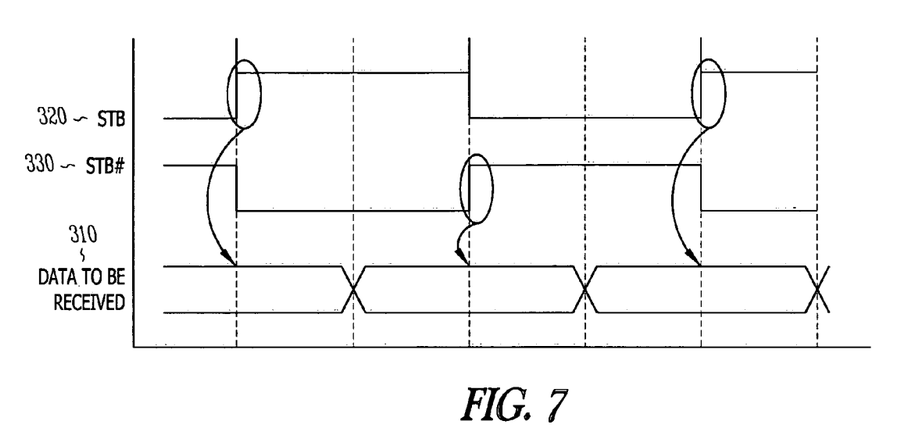
FIG. 7 illustrates waveforms of data and strobe signals received at a receiving device.

For example, FIGS. 3–7 illustrates an example implementation of current source synchronous strobe schemes that are disadvantageous in terms of system performance and data transfer rates. More specifically, FIG. 3 illustrates an example waveform diagram of data (incoming data signal) and a strobe signal used to latch data at a receiving device 120 utilizing a current source synchronous strobe scheme. FIG. 4 illustrates an example timing eye diagram of the current source synchronous strobe scheme. FIGS. 5A–5B illustrate an example timing eye diagram of the current source synchronous strobe scheme due to slow falling edges or fast falling edges of incoming data. FIG. 6 illustrates an example timing eye diagram of the current source synchronous strobe scheme due to potential slow or fast falling edges of incoming data. FIG. 7 illustrates waveforms of data and strobe signals received at a receiving device 120 shown in FIG. 1.

Referring now to FIG. 3, an example waveform diagram of data (incoming data signal) and a strobe signal used to latch data at a receiving device 120 utilizing a current source synchronous strobe scheme is illustrated. As shown in FIG. 3, data 310 is received at the receiving device 120, via the bus 130 (see FIG. 1) along with a strobe signal "STB" 320 and its compliment "STB#" (not shown). A reference voltage $V_{ref}$ is typically used at the receiving device 120 to serve as a reference point for the receiving device 120 to determine data transitions (i.e., rising and falling edges of the data) as the data is transitioned from a "low" (0) logic state to a "high" (1) logic state or vice versa, and strobe transitions (i.e., rising and falling edges of the strobe signal "STB"). In general, data 310 transmitted from the transmitting device 110, for example, must be latched or matched at the receiving device 120 using the strobe signal "STB" 320 and its complement "STB#" (not shown) within a timing window 340 (i.e., the time from outputting data from the transmitting device to the time that the receiving device samples such data in a clock cycle), for subsequent data processing functions.

For purposes of maximizing timings and data transfer rates on the bus 130, the timing window 340 needs to be as wide as possible with stabilized set-up time 350 and hold time 360. Both the set-up time 350 and the hold time 360 represent timing margins within the timing window 340 that determine the system performance and increase bus speed. The set-up time 350 is the amount of time after the data 310 is valid at the receiving device 120 and when the strobe (clock) signal "STB" 320 arrives. The hold time 360 is the amount of time that data 310 is valid after the strobe signal "STB" 320 has arrived. The larger the set-up time 350 and the hold time 360, the faster the frequency the bus 130 may be obtained, for other data processing functions.

FIG. 4 illustrates an example timing eye diagram of the current source synchronous strobe scheme, when both rising edges and falling edges of data and strobe signals are identical in an ideal state. The timing window 340 is the sum of the set-up time 350 and the hold time 360. The strobe signal "STB" 320 may be centered at the midpoint of the timing window, and may be used by the receiving device 120 to latch or match the data 310 within the timing window 340, for subsequent data processing functions.

However, in practice as discussed, the rising and falling edges of data 310 are not identical due to process variations, different supply return paths, noise or other effects. For example, the process variations typically occur when the IC transistors are over-doped (i.e., fast transistors) or under-doped (i.e., slow transistors). Likewise, noise occurs during data transmission that may cause transistors to switch too fast or too slow. As a result, the timing window (timing eye) 340 can be reduced because of a reduced set-up time 350, occurred when the rising or falling edges of such data 310 are slower than expected, or a reduced hold time 360, occurred when the rising or falling edges of such data 310 are faster than expected.

For example, FIGS. 5A–5B illustrate an example timing eye diagram of the current source synchronous strobe scheme due to slow falling edges or fast falling edges of data. As shown in FIG. 5A, the set-up time 350 may be reduced due to slow falling edges of data 310 as the difference between the falling edge of data 310 and the rising edge of the strobe signal "STB" 320 used to latch or match the data 310 is smaller. Likewise, the hold time 360 may be reduced due to fast falling edges of data 310 as the difference between the rising edge of the strobe signal "STB" 320 used to latch or match the data 310 and the falling edge of data 310 is smaller. Because of the systematic or consistent variations between the rising and falling edges on the bus 130 (i.e., falling edges of data that are potentially systematically slow or systematically fast), most current source synchronous bus systems must be disadvantageously designed to account both reduced set-up time 350 and reduced hold time 360 at the receiving device 120 as shown in FIG. 6. As a result, when only the rising edge or the falling edge of a strobe signal "STB" 320 or its complement "STB#" 330 is used at the receiving device 120 utilizing the current source synchronous strobe scheme to latch or match the data 310, as shown in FIG. 7, the system performance can be significantly reduced and, likewise, the data transfer rates between the transmitting device 110 and the receiving device 120 cannot be maximized.

Figure 8:
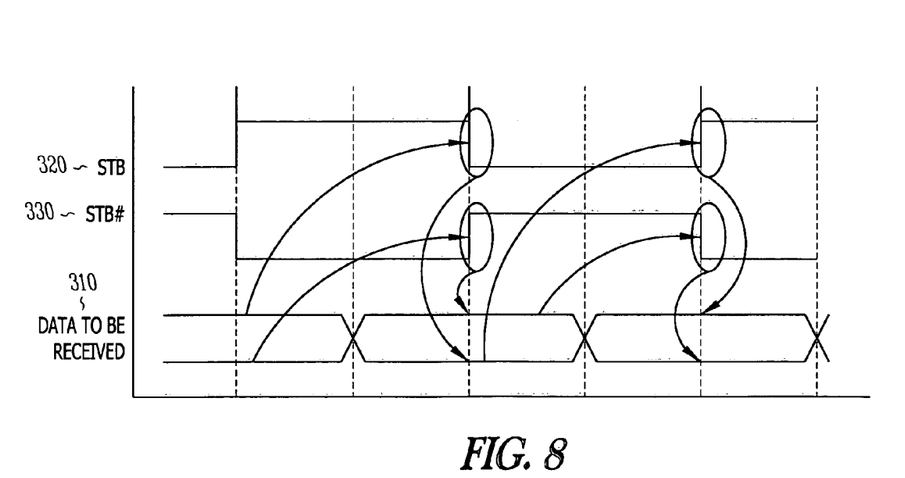
FIG. 8 illustrates waveforms of data and strobe signals received at a receiving device utilizing a same edge source synchronous strobe scheme according to an embodiment of the present invention.

Turning now to FIG. 8, waveforms of data and strobe signals received at a receiving device utilizing a same edge source synchronous strobe scheme according to an embodiment of the present invention are illustrated. The essence of the same edge strobing for source synchronous buses is that there are systematic differences between rising and falling edges on a bus 130 and that the receiving device (for example, the receiving device 120 shown in FIG. 1) has access to its past state and can therefore predict whether the next edge the receiving device 120 receives will be a rising or falling edge. This allows the receiving device 120 to choose between the strobe signal "STB" 320 and its strobe complement "STB#" 330 for the proper rising or falling edge and therefore compensate for the systematic differences between rising and falling edges. As a result, improved timings can be obtained by providing a wider timing window 340 (sum of setup and hold times at the receiving device 120) and by stabilizing the set-up time 350 available to the receiving device 120. The benefits of a stabilized setup time 350 and a wider timing window 340 will allow designers to move the new found margin in the set-up window to the hold window permitting higher data transfer rates on the bus 130.

As shown in FIG. 8, both the rising and falling edges of a strobe signal "STB" 320 and its complement "STB#" 330 are used at a receiving device 120 to latch or match the data 310. In particular, either the rising edge or the falling edge of either a strobe signal "STB" 320 or its complement "STB#" 330 is selected by the receiving device 120 to latch or match the same edge of data 310, i.e., a corresponding rising or falling edge of the data 310. According to an embodiment of the present invention, the same edge strobing advantageously enables the receiving device 120 to select the incoming strobe signal "STB" 320 or its complement "STB#" 330 to clock in the data 310. Since the previous logic state (high or low) of the data 310 is known, the receiving device 120 can determine what type of incoming edge it will experience (rising or falling).

Figure 9A:
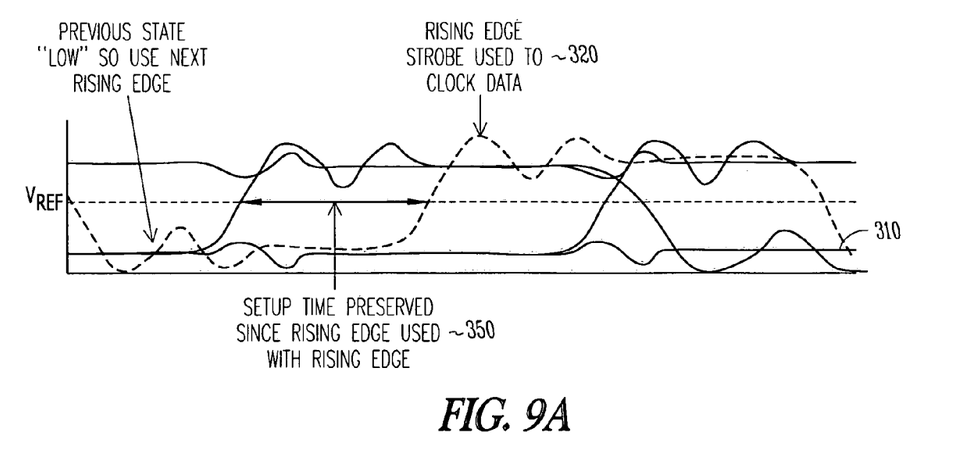
FIGS. 9A–9B illustrate an example timing eye diagram of a same edge source synchronous strobe scheme according to an embodiment of the present invention.
Figure 9B:
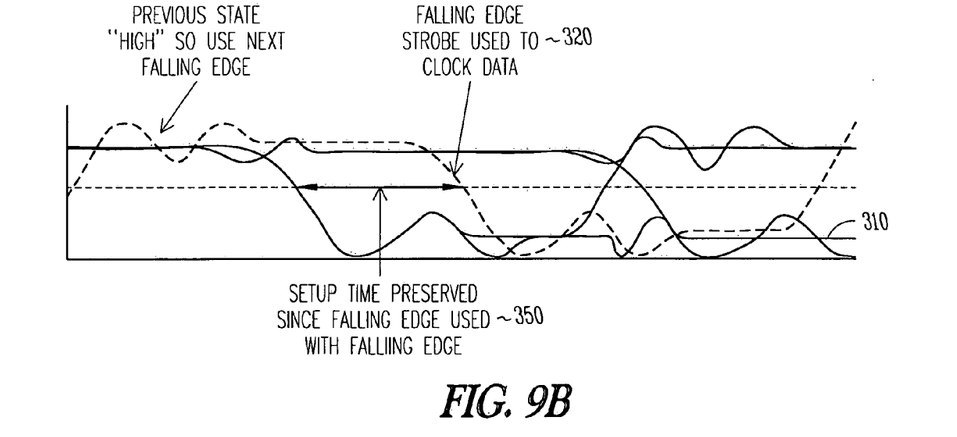

More specifically, FIGS. 9A–9B illustrate an example timing eye diagram of same edge source synchronous strobe scheme according to an embodiment of the present invention. Both the data 310 and the strobe signal "STB" 320 and its strobe complement "STB#" 330 are received at the receiving device 120. If the previous logic state of the data 310 is "low" (0), and the data 310 is about to transition from "low" (0) to "high" (1), as shown in FIG. 9A, the receiving device 120 will utilize a rising edge of the strobe signal "STB" 320 or its strobe complement "STB#" 330, as shown in FIG. 8, to latch or match the next rising edge of the data 310, for further data processing functions. As a result, the set-up time 350 within the data window 340, as described with reference to FIGS. 3–6, may be preserved since the rising edge of the strobe signal "STB" 320 or its complement "STB#" 330 to latch or match the next rising edge of the data 310.

Similarly, if the previous logic state of the data 310 is "high" (1), and the data 310 is about to transition from "high" (1) to "low" (0), as shown in FIG. 9B, the receiving device 120 will utilize a falling edge of the strobe signal "STB" 320 or its strobe complement "STB#" 330, as shown in FIG. 8, to latch or match the next falling edge of the data 310, for further data processing functions. As a result, the set-up time 350 within the data window 340, as described with reference to FIGS. 3–6, may be preserved since the falling edge of the strobe signal "STB" 320 or its strobe complement "STB#" 330 to latch or match the next falling edge of the data 310.

According to the present invention, the same edge source synchronous strobe scheme can be implemented in many ways. Data 310, as shown in FIG. 8 and FIGS. 9A–9B, may be latched by alternating distributing the strobe signal "STB" 320 alternated with its strobe complement "STB#" 330 to each of the data receiver cells/packets to latch the data 310 into one or more flip flops or latches for subsequent data processing functions. In addition, the same edge source synchronous strobing can also be implemented on any source synchronous bus such as busses used with microprocessors such as Intel® Celeron™ and Pentium® processors, and high-speed memory busses and DDR (double data-rate) products to provide higher performance. Implementation of source synchronous strobing may also be backwards compatible and, as a result, does not require redesign of the bus 130 or all of its components.

Figure 10:
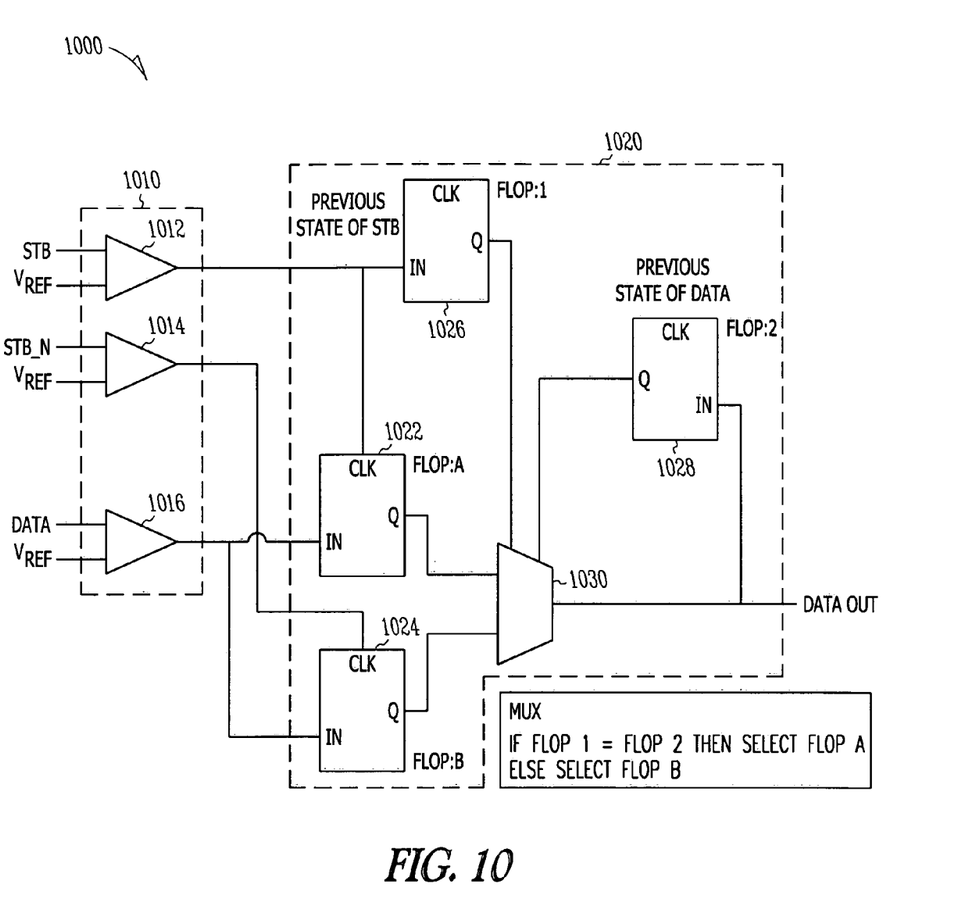
FIG. 10 illustrates an example same edge strobe circuit installed at a receiving device to perform the same edge source synchronous strobing according to an embodiment of the present invention.

FIG. 10 illustrates an example circuit implementation installed at a receiving device 120 (e.g., part of the I/O circuit 200, shown in FIG. 2) to perform the same edge source synchronous strobing scheme according to an embodiment of the present invention. As shown in FIG. 10, the same edge source synchronous strobe circuit 1000 may comprise an input circuit 1010 adapted to receive the incoming data 310 and the strobe signal "STB" 320 and its strobe complement "STB#" 330 transmitted along a transmission path of the data 310 from the bus 130 (see FIGS. 1–2 and FIGS. 8–9); and a latch circuit 1020 adapted to select a rising edge or a falling edge of either the strobe signal "STB" 320 or its complement "STB#" 330 to latch or match a corresponding rising edge or falling edge of the incoming data 310 received from the bus 130, for subsequent data processing functions. The latch circuit 1020 selects a rising edge of the strobe signal "STB" 320 or its complement "STB#" 330 to latch the data 310, when the data 310 is transitioned from a logic "low" state to a logic "high" state. Alternatively, the latch circuit 1020 selects a falling edge of the strobe signal "STB" 320 or its complement "STB#" 330 to latch the data 310, when the data 310 is transitioned from a logic "high" state to a logic "low" state.

As shown in FIG. 10, the input circuit 1010 may comprise a plurality of buffers or pass-gates, such as, for example, a first buffer 1012 coupled to receive the strobe signal "STB" 320, via the bus 130; a second buffer 1014 coupled to receive the strobe complement "STB#" 330, via the bus 130; and a third buffer 1016 coupled to receive the data 310, via the bus 130.

The latch circuit 1020 may comprise a plurality of flip-flops or latch elements arranged to latch the data 310, and a multiplexor "MUX" or selector arranged to select a rising edge or a falling edge of either the strobe signal "STB" 320 or its complement "STB#" 330 to latch or match a corresponding rising edge or falling edge of the incoming data 310 received from the bus 130. More specifically, the latch circuit 1020 comprises a first flip-flop (or latch) 1022 having a data input coupled to receive the data 310, a clock input driven by the strobe signal "STB" 320; a second flip-flop (or latch) 1024 having a data input coupled to receive the data 310, a clock input driven by the strobe complement "STB#" 330; a third flip-flop (or latch) 1026 having a data input coupled to receive the strobe signal "STB" 320; a fourth flip-flop 1028 having a data input coupled to receive latched data output; and a selector "MUX" 1030 coupled to select the output of one of the first flip-flop 1022 and the second flip-flop 1024 as the latched data output in accordance with outputs of the third flip-flop 1026 and the fourth flip-flop 1028. More specifically, the selector "MUX" 1030 selects the output of the first flip-flop 1022 as the latched data, when the output of the third flip-flop 1026 equals to the output of the fourth flip-flop 1028. Alternatively, the selector "MUX" 1030 selects the output of the second flip-flop 1024 as the latched data, when the output of the third flip-flop 1026 is not equal to the output of the fourth flip-flop 1028.

Figure 11:
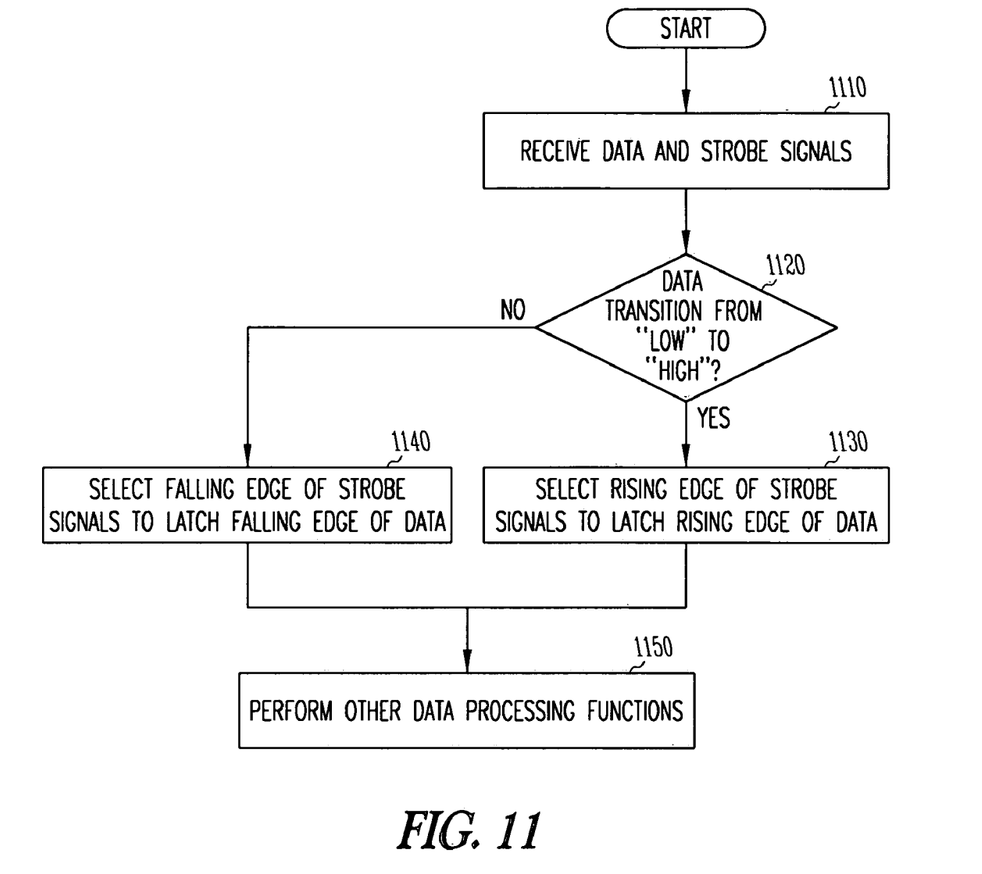
FIG. 11 illustrates an example same edge source synchronous strobing operation performed by a receiving device according to an embodiment of the present invention.

FIG. 11 illustrates an example same edge source synchronous strobing operation performed by a receiving device according to an embodiment of the present invention. Such same edge strobing operation can be performed by the same edge source synchronous strobe circuit 1000 as described with reference to FIG. 10, or by any combination of hardware logic implemented at the receiving device 120 shown in FIG. 1. As shown in FIG. 11, the same edge strobing operation may be activated at the receiving device 120 to receive the data 310 and the strobe signal "STB" 320 and its complement "STB#" 330 transmitted along the same transmission path of the data 310, via a bus 130, at block 1110. Next, the receiving device 120 determines if the data 310 is about to transition from a logic "low" state to a logic "high" state, or from a logic "high" state to a logic "low" state at block 1120. If the data 310 is to transition from a logic "low" state to a logic "high" state, the receiving device 120 then selects a rising edge of the strobe signal "STB" 320 or its complement "STB#" 330 to latch or match the rising edge of the data 310 at block 1130. Alternatively, if the data 310 is to transition from a logic "high" state to a logic "low" state, the receiving device 120 then selects a falling edge of the strobe signal "STB" 320 or its complement "STB#" 330 to latch or match the falling edge of the data 310 at block 1140. After either the rising edge or the falling edge of the strobe signal "STB" 320 or its complement "STB#" 330 is selected to latch the corresponding rising or falling edge of the data 310, the receiving device 120 then performs other data processing functions at block 1150.

Figure 12:
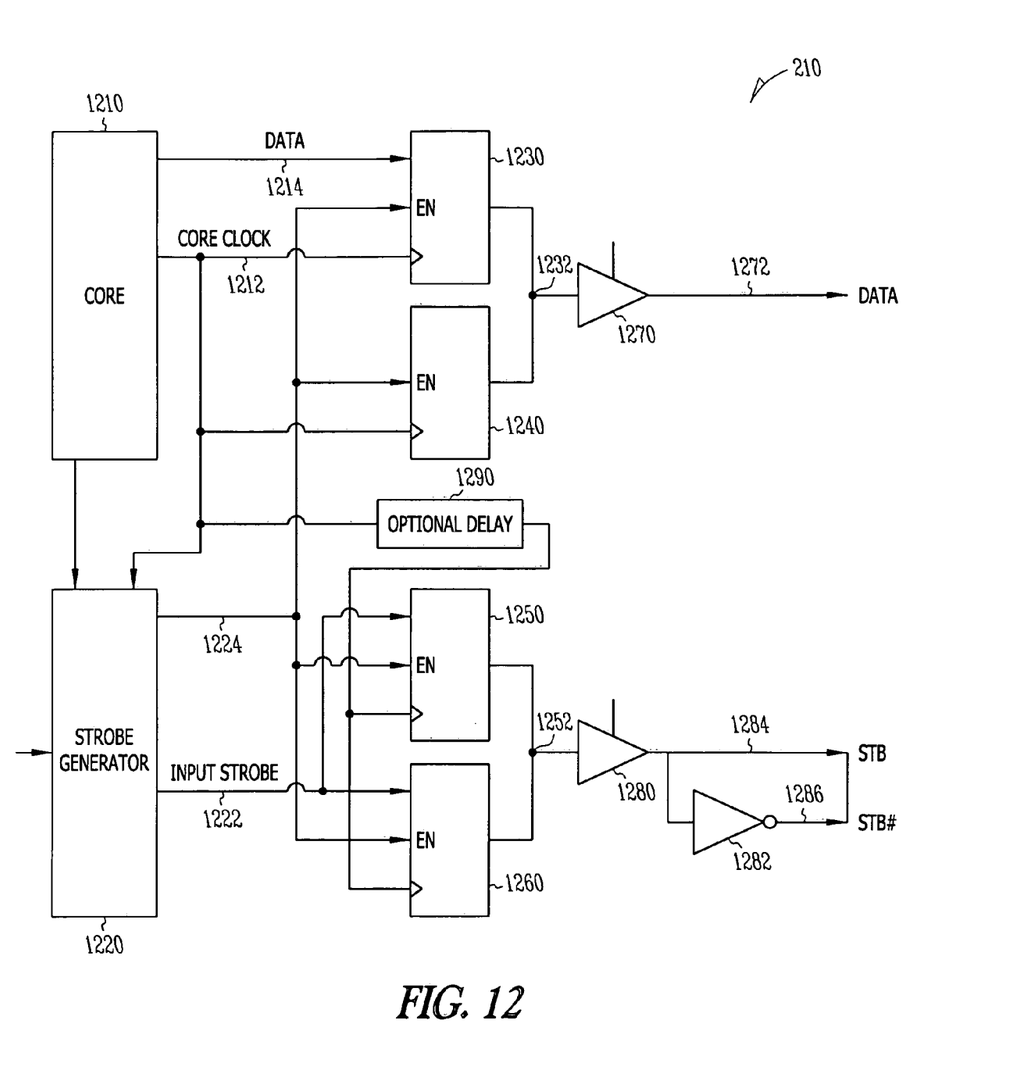
FIG. 12 illustrates an example source synchronous driver installed at a transmitting device to generate data and strobe signals for the same edge source synchronous strobing according to an embodiment of the present invention.

Referring now to FIG. 12, an example source synchronous driver 210 installed at a transmitting device 110 for generating data 310 and a strobe signal "STB" 320 and its complement "STB#" 330 according to an embodiment of the present invention is illustrated. In a source synchronous arrangement, the strobe (clock) signal "STB" 320 and its complement "STB#" 330 that are transmitted by the driver 210 to the same edge source synchronous strobe circuit 1000 installed in the receiving device 120 to latch the transmitted data.

As shown in FIG. 12, the source synchronous driver 210 may comprise a core 1210 to generate a data signal and a core clock signal; a strobe generator 1220 to generate an input strobe; a plurality of latches 1230–1260 to latch data and the input strobe; a data driver circuit 1270 to drive the data 310, via the bus 130 (see FIG. 1); a strobe driver circuit 1272 including an inverter 1274 to drive the strobe signal "STB" 320 and its complement "STB#" 330, via the bus 130; and an optional delay 1280 arranged to center or otherwise adjust the position of the strobe signal "STB" 320 and its complement "STB#" 330.

The core 1210 operates at a core clock frequency to generate a data signal on line 1214 to be driven by the data driver circuit 1270 on line 1272, and a core clock signal on line 1212. The strobe generator 1220 receives a cycle request on line 1216 and the core clock signal on line 1212 and generates an input strobe on line 1222 and one or more enable signals on line 1224 to latch the data signal and to drive the data 310 on line 1272 to the bus 130 synchronized with the strobe signal "STB" 320 on line 1284 and its strobe complement "STB#" 330 on line 1286. Data 310 and strobe signals 320–330 are respectively transmitted to the receiving device 120 on data line 1272 and strobe lines 1284 and 1286, and may transition with the same frequency as the core frequency, at an even fraction of the core frequency (e.g., ½ or ⅓ etc.), or at an odd fraction of the core frequency (e.g., ⅔ or ⅖ etc.) To accommodate the odd fractional *interface*, the source synchronous driver 210 may drive the data 310 *and/or* the strobe signals "STB" 320 and "STB#" 330 on both rising and falling clock edges of the core clock signal that is provided on line 1212.

A first signal latch 1230 may be a rising edge triggered latch coupled to receive the core clock signal and to pass the input data signal to a pre-driver node 1232 at a rising edge of the core clock signal. A second signal latch 1240 may be a falling edge triggered latch coupled to receive the core clock signal and pass the input data signal to the pre-driver node 1232 on falling edges of the core clock signal.

The strobe generator 1220 also generates enable signals on enable line 1224 for the latches 1230 and 1240 according to signals received at the mode input(s). In an odd fractional mode (e.g., 2:N, N=3, 5, etc.), the enable signals may cause the latches 1230–1240 to be alternately enabled so that subsequent input signals transitions are driven to the pre-driver node 1232 on rising and falling edges of the core clock signal. In even modes (e.g., 1:1, 1:2, 1:3), enable signals may be driven off the same edge of the core clock signal, so one of the two latches 1230–1240 may not need to be used.

The input strobe on line 1222 is generally located (i.e., it transitions or triggers the latch) at an intermediate point in the bus cycle in which the data signal is transmitted in order to properly latch the received data signal. In some embodiments, the strobe may be centered or approximately centered at the midpoint of the bus cycle. The strobe position may vary in different embodiments as long as it is available to latch the data signals with which the strobe is transmitted.

In order to center or otherwise adjust the position of the strobe signal, an optional delay circuit 1290 may be used. As shown in FIG. 12, the core clock signal may be delayed and a delayed clock (DCLK) signal may be generated and then used to trigger a rising edge triggered latch 1250 and a falling edge triggered latch 1260 in a manner similar to the latches 1230–1240. The delayed clock may be used to place strobe edges in locations where the core clock signal does not transition. For example, there may not be a transition of the core clock signal (either rising or falling) available to trigger a strobe at the midpoint of a bus cycle when a two-thirds bus to core frequency ratio is used.

Alternatively, the strobe may be generated at another intermediate point in the bus cycle when the core frequency is greater than the bus frequency. For example, an internal core clock transition occurring after the bus cycle begins may be used to generate the strobe. This strobe may not be centered but may still be used to latch the signal, thereby obviating the need for the optional delay circuit 1290.

The strobe generator 1220 also generates an input strobe on line 1220 that is fed into both latches 1250–1260, and enable signals that enable the latches 1250–1260 on line 1224 depending on the mode indicated by mode input(s). Thus, latches 1250–1260 alternate driving a strobe pre-driver node 1252 in odd fractional modes. In even modes the strobe may be driven off one edge of the core clock signal, so only one of the two latches 1250–1260 may need to be used.

When data 310 is to be driven from the source synchronous driver 210 to the receiving device 120, enable (OE) signals are asserted or remain asserted for enabling the signal and strobe output driver circuits 1270 and 1280. The data 310 and the strobe signals "STB" 320 and "STB#" 330 may be synchronized so that they are driven to the receiving device 120 with a controlled relationship based on the core clock signal. Thus, the embodiment of FIG. 12 provides for source synchronous transmission of data 310 and strobe signals "STB" 320 and its complement "STB#" 330 from a transmitting device 110 to the same edge source synchronous strobe circuit 1000 installed at a receiving device 120, via a bus 130.

As described from the foregoing, the present invention advantageously provides a same edge source synchronous strobing system in which the systematic variation between the rising and falling edges of the data and strobe signals can be effectively and efficiently compensated in order to provide improved timings and enhanced system performance. The same edge source synchronous strobing allows improved timings by providing a wider timing window (sum of setup and hold times at the receiving device 120) and by stabilizing the set-up time available to the receiving device, thereby permitting higher data transfer rates on the bus. Such same edge strobing can also be implemented on any source synchronous bus such as busses used with microprocessors such as Intel® Celeron™ and Pentium® processors, and high-speed memory busses and DDR (double data-rate) products to provide higher performance. Implementation of source synchronous strobing may also be backwards compatible and, as a result, does not require redesign of the bus 130 or all of its components.

While there have been illustrated and described what are considered to be example embodiments of the present invention, it will be understood by those skilled in the art and as technology develops that various changes and modifications may be made, and equivalents may be substituted for elements thereof without departing from the true scope of the present invention. Many modifications may be made to adapt the teachings of the present invention to a particular situation without departing from the scope thereof. For example, the electronic system 100 shown in FIG. 1 is merely one example of an electronic system in which the present invention can be used. Other types of electronic systems with which the present invention can be used include communications devices (e.g., cellular phones, cordless phones, pagers, etc.), computer-related peripherals (e.g., printers, scanners, monitors, etc.); entertainment devices (e.g., televisions, radios, stereos, tape and compact disc players, video cassette recorders, MP3 (Motion Picture Experts Group, Audio Layer 3) players, etc.); aerospace equipment; automotive equipment; and similar electronic systems. In addition, the same edge source synchronous strobing can be implemented in any combination of hardware logic as long as the latching operation as described with reference to FIG. 11 is followed. Therefore, the same edge source synchronous strobe circuit shown in FIG. 10 is merely one example implementation in which the present invention can be used. Likewise, the source synchronous driver shown in FIG. 12 is also one example implementation in which the present invention can be used. Other type of drivers can also be used as long as such drivers can generate data signal and strobe signals. Accordingly, in view of the alternative possibilities, it is intended, therefore, that the present invention not be limited to the various example embodiments disclosed, but that the present invention includes all embodiments falling within the scope of the appended claims.

What is claimed is:

1. An edge strobe circuit comprising:
   an input circuit adapted to receive incoming data and strobe signals transmitted along a transmission path of the incoming data; and
   a latch circuit adapted to select one of rising and falling edges of the strobe signals to latch a corresponding one of rising and falling edges of the incoming data received for subsequent data processing functions, the latch circuit including,
      a first flip-flop having a data input coupled to receive the data, a clock input driven by the first strobe signal, and an output;
      a second flip-flop having a data input coupled to receive the data, a clock input driven by the second strobe signal, and an output;

a third flip-flop having a data input coupled to receive the first strobe signal, and an output;

a fourth flip-flop having a data input coupled to receive latched data, and an output; and a selector to select the output of the first flip-flop as the latched data when the output of the third flip-flop corresponds to the output of the fourth flip-flop and, alternatively, select the output of the second flip-flop as the latched data when the output of the third flip-flop does not correspond to the output of the fourth flip-flop.

2. The edge strobe receiver circuit as claimed in claim 1, wherein the strobe signals include a first strobe signal and a second strobe signal exhibiting logic states complementary to the logic states of the first strobe signal.

3. The edge strobe circuit as claimed in claim 2, wherein, when the data is transitioned from a "high" state to a "low" state, the latch circuit selects a falling edge of the strobe signals to latch the data and, when the data is transitioned from a "low" state to a "high" state, the latch circuit selects a rising edge of the strobe signals to latch the data in order to compensate for systematic differences between rising and falling edges of the data received, via a bus.

4. The edge strobe circuit as claimed in claim 3, wherein the input circuit comprises:
   a first buffer coupled to receive the first strobe signal, via the bus;
   a second buffer coupled to receive the second strobe signal, via the bus; and
   a third buffer coupled to receive the data, via the bus.

5. The edge strobe circuit as claimed in claim 2, wherein the data is latched by alternately distributing the first strobe signal alternated with the second strobe signal to each data packet/cell.

6. The edge strobe circuit as claimed in claim 2, wherein the bus is one of a front side bus (FSB), a memory bus and a graphics bus.

7. The edge strobe circuit as claimed in claim 1, wherein the selector includes a multiplexor.

8. An edge strobe circuit comprising:
   an input circuit adapted to receive incoming data and strobe signals transmitted along a transmission path of the incoming data; and
   a latch circuit adapted to select one of rising and falling edges of the strobe signals to latch a corresponding one of rising and falling edges of the incoming data received for subsequent data processing functions, wherein the strobe signals include a first strobe signal and a second strobe signal exhibiting logic states complementary to the logic states of the first strobe signal, wherein, when the data is transitioned from a "high" state to a "low" state, the latch circuit selects a falling edge of the strobe signals to latch the data and, when the data is transitioned from a "low" state to a "high" state, the latch circuit selects a rising edge of the strobe signals to latch the data in order to compensate for systematic differences between rising and falling edges of the data received, via a bus, wherein the latch circuit comprises,
   a first flip-flop having a data input coupled to receive the data, a clock input driven by the first strobe signal, and an output;
   a second flip-flop having a data input coupled to receive the data, a clock input driven by the second strobe signal, and an output;
   a third flip-flop having a data input coupled to receive the first strobe signal, and an output;
   a fourth flip-flop having a data input coupled to receive latched data, and an output; and
   a selector coupled to select the output of one of the first flip-flop and the second flip-flop as the latched data in accordance with the outputs of the third flip-flop and the fourth flip-flop, and, wherein the selector is a multiplexor arranged to select the output of the first flip-flop as the latched data when the output of the third flip-flop corresponds to the output of the fourth flip-flop and, alternatively, select the output of the second flip-flop as the latched data when the output of the third flip-flop does not correspond to the output of the fourth flip-flop.

9. A method for same edge source synchronous data strobing, comprising:
   receiving incoming data, via a bus, and strobe signals transmitted along a transmission path of the incoming data, via the bus; and
   selecting one of rising and falling edges of the strobe signals to latch a corresponding one of rising and falling edges of the incoming data received for subsequent data processing functions, wherein receiving incoming data and strobe signals are received at a circuit, the circuit including a first flip-flop having a data input coupled to receive the data, a clock input driven by the first strobe signal, and an output; a second flip-flop having a data input coupled to receive the data, a clock input driven by the second strobe signal, and an output; a third flip-flop having a data input coupled to receive the first strobe signal, and an output; a fourth flip-flop having a data input coupled to receive latched data, and an output; and a selector to select the output of the first flip-flop as the latched data when the output of the third flip-flop corresponds to the output of the fourth flip-flop and, alternatively, select the output of the second flip-flop as the latched data when the output of the third flip-flop does not correspond to the output of the fourth flip-flop.

10. The method as claimed in claim 9, wherein the strobe signals include a first strobe signal and a second strobe signal exhibiting logic states complementary to the logic states of the first strobe signal.

11. The method as claimed in claim 10, wherein, when the data is transitioned from a "high" state to a "low" state, a falling edge of the strobe signals is selected to latch the data and, when the data is transitioned from a "low" state to a "high" state, a rising edge of the strobe signals is selected to latch the data in order to compensate for systematic differences between rising and falling edges of the data received, via the bus.

12. The method as claimed in claim 9, wherein the bus is one of a front side bus (FSB), a memory bus and a graphics bus.

13. A source synchronous bus system comprising:
   a bus;
   a first device connected to the bus, having a driver to drive data and strobe signals, via the bus; and
   a second device connected to the bus, having a receiver to receive data and the strobe signals from the bus, and to select one of rising and falling edges of the strobe signals to latch a corresponding one of rising and falling edges of the data received from the bus, for subsequent data processing functions, the receiver comprising,
   a first flip-flop having a data input coupled to receive the data, a clock input driven by the first strobe signal, and an output;

a second flip-flop having a data input coupled to receive the data, a clock input driven by the second strobe signal, and an output;

a third flip-flop having a data input coupled to receive the first strobe signal, and an output;

a fourth flip-flop having a data input coupled to receive latched data, and an output; and a selector to select the output of the first flip-flop as the latched data when the output of the third flip-flop corresponds to the output of the fourth flip-flop and, alternatively, select the output of the second flip-flop as the latched data when the output of the third flip-flop does not corresponds to the output of the fourth flip-flop.

14. The source synchronous bus system as claimed in claim 13, wherein the strobe signals include a first strobe signal and a second strobe signal exhibiting logic states complementary to the logic states of the first strobe signal.

15. The source synchronous bus system as claimed in claim 14, wherein, when the data is transitioned from a "high" state to a "low" state, the receiver selects a falling edge of the strobe signals to latch the data and, when the data is transitioned from a "low" state to a "high" state, the receiver selects a rising edge of the strobe signals to latch the data in order to compensate for systematic differences between rising and falling edges of the data received, via the bus.

16. The source synchronous bus system as claimed in claim 13, wherein the receiver further comprises an input circuit adapted to receive the data and strobe signals transmitted along a transmission path of the data.

17. The source synchronous bus system as claimed in claim 16, wherein the input circuit comprises:

a first buffer coupled to receive the first strobe signal, via the bus;

a second buffer coupled to receive the second strobe signal, via the bus; and a third buffer coupled to received the data, via the bus.

18. The source synchronous bus system as claimed in claim 13, wherein the selector includes a multiplexor.

19. The source synchronous bus system as claimed in claim 18, wherein the data is latched by alternately distributing the first strobe signal alternated with the second strobe signal to each data packet/cell.

20. The source synchronous bus system as claimed in claim 13, wherein the first device is a processor, the second device is a chipset logic, and the bus is a front side bus (FSB).

21. The source synchronous bus system as claimed in claim 13, wherein the first device is a chipset logic, the second device is a graphics controller, and the bus is a graphics bus.

22. The source synchronous bus system as claimed in claim 13, wherein the first device is a chipset logic, the second device is a memory device, and the bus is one of a memory bus and a double data rate (DDR) bus.

23. A source synchronous bus system comprising:

a bus;

a first device connected to the bus, having a driver to drive data and strobe signals, via the bus; and a second device connected to the bus, having a receiver to receive data and the strobe signals from the bus, and to select one of rising and falling edges of the strobe signals to latch a corresponding one of rising and falling edges of the data received from the bus, for subsequent data processing functions, wherein the strobe signals include a first strobe signal and a second strobe signal exhibiting logic states complementary to the logic states of the first strobe signal, wherein the receiver comprises an input circuit adapted to receive the data and strobe signals transmitted along a transmission path of the data, and a latch circuit adapted to select rising edges of the strobe signals to latch rising edges of the data, and to select falling edges of the strobe signals to latch falling edges of the data, for subsequent data processing functions, wherein the latch circuit comprises, a first flip-flop having a data input coupled to receive the data, a clock input driven by the first strobe signal, and an output;

a second flip-flop having a data input coupled to receive the data, a clock input driven by the second strobe signal, and an output;

a third flip-flop having a data input coupled to receive the first strobe signal, and an output;

a fourth flip-flop having a data input coupled to receive latched data, and an output; and a selector coupled to select the output of one of the first flip-flop and the second flip-flop as the latched data in accordance with the outputs of the third flip-flop and the fourth flip-flop, and wherein the selector is a multiplexor arranged to select the output of the first flip-flop as the latched data when the output of the third flip-flop corresponds to the output of the fourth flip-flop and, alternatively, select the output of the second flip-flop as the latched data when the output of the third flip-flop does not corresponds to the output of the fourth flip-flop.

* * * * *